United States Patent [19]
Haney et al.

[11] Patent Number: 6,132,632
[45] Date of Patent: Oct. 17, 2000

[54] METHOD AND APPARATUS FOR ACHIEVING ETCH RATE UNIFORMITY IN A REACTIVE ION ETCHER

[75] Inventors: David Emery Haney, San Jose; Robert James Huber, Mountain View; Cherngye Hwang, San Jose; Diana Perez, San Jose; John Wesley Williams, San Jose, all of Calif.

[73] Assignee: International Business Machines Corporation, Armonk, N.Y.

[21] Appl. No.: 08/927,186

[22] Filed: Sep. 11, 1997

[51] Int. Cl.[7] ............................. C23C 16/00; B44C 1/22
[52] U.S. Cl. ............................ 216/70; 216/67; 438/732
[58] Field of Search ................................ 438/732; 216/67, 216/70; 156/345

[56] References Cited

U.S. PATENT DOCUMENTS

| | | | |
|---|---|---|---|
| 4,424,102 | 1/1984 | Brandeis et al. | 204/192.32 |
| 4,632,719 | 12/1986 | Chow et al. | 156/345 |
| 4,842,683 | 6/1989 | Cheng et al. | 156/345 |
| 5,079,481 | 1/1992 | Moslehi | 315/111.41 |
| 5,082,542 | 1/1992 | Moslehi et al. | 204/192.32 |
| 5,314,597 | 5/1994 | Harra | 204/192.13 |
| 5,399,253 | 3/1995 | Grünenfelder | 204/298.2 |
| 5,401,351 | 3/1995 | Samukawa | 156/345 |
| 5,534,108 | 7/1996 | Qian et al. | 216/68 |
| 5,647,945 | 7/1997 | Matsuse et al. | 156/345 |
| 5,707,452 | 1/1998 | Dandl | 118/723 MW |

*Primary Examiner*—Randy Gulakowski
*Assistant Examiner*—Shamim Ahmed
*Attorney, Agent, or Firm*—Altera Law Group, LLC

[57] ABSTRACT

A method and apparatus for achieving etch rate uniformity in a reactive ion etcher. The reactive ion etcher generates a plasma within a vacuum chamber for etching a substrate disposed at a cathode of a reactor can within the chamber wherein the plasma emanates from a top plate of the reactor can, and is influenced by localized magnetic fields for locally controlling etch rates across the cathode to produce a uniform etch rate distribution across the cathode as a result of the localized magnetic field. The magnet array may be disposed between the top plate and the vacuum chamber for providing the localized magnetic fields. The magnet array includes a plurality of individual magnets and a grid plate for holding the individual magnets in position.

8 Claims, 5 Drawing Sheets

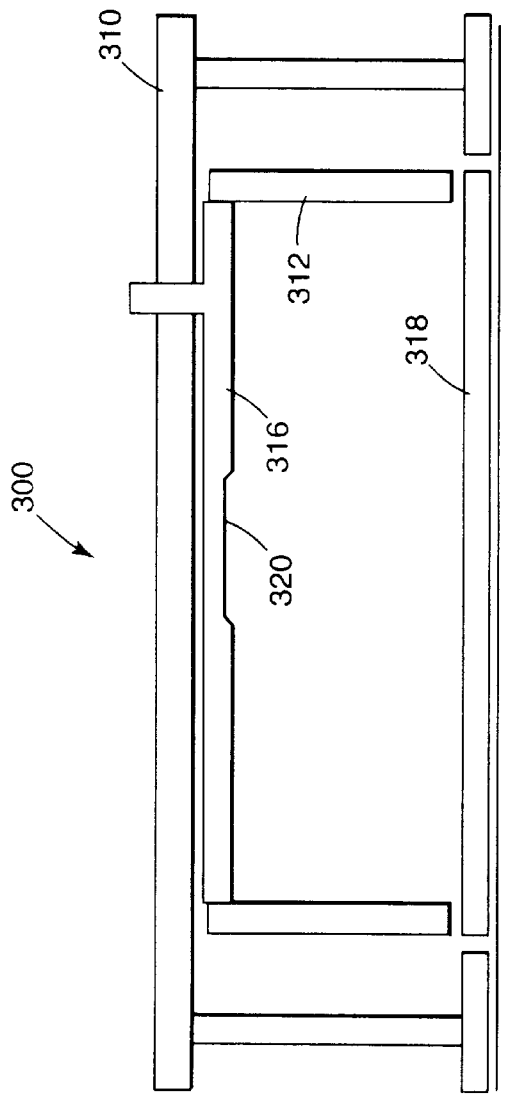
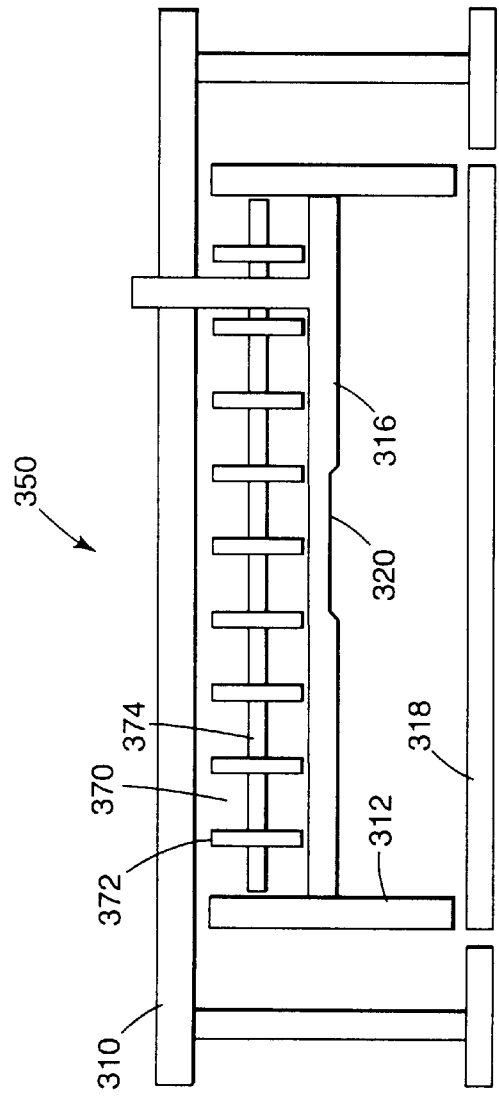
Fig. 3a Prior Art
Fig. 3b

| Run Without Magnet | | | |
|---|---|---|---|
| Position | Etch Depth, D (A) | Roughness, Ra (A) | Ra/D (%) |
| 45 (CTR) | 15093 | 116 | 0.8 |
| 50 | 14255 | 112 | 0.8 |

| Run With Magnet Array | | | |
|---|---|---|---|
| Position | Etch Depth, D (A) | Roughness, Ra (A) | Ra/D (%) |
| 45 (CTR) | 14678 | 115 | 0.8 |
| 50 | 19133 | 113 | 0.6 |

Fig. 5

METHOD AND APPARATUS FOR ACHIEVING ETCH RATE UNIFORMITY IN A REACTIVE ION ETCHER

BACKGROUND OF THE INVENTION

1. Field of the Invention

This invention relates in general to a method and apparatus for reactive ion etching, and more particularly to a method and apparatus for achieving etch rate uniformity in a reactive ion etcher.

2. Description of Related Art

In the data storage industry, the most widely used storage device is the magnetic hard disk drive (HDD). The HDD uses magnetic heads, which fly over the magnetic disk, to read and write the data from/to the magnetic disk. In order for the head to fly over the disk in a predictable and stable fashion, the head is incorporated in a slider body with an air bearing surface (ABS) facing the disk. With a proper air bearing design, the slider can be flown very closely over the disk. Currently the flying height of the slider over the disk is in the range of 2–3 micro-inches (0.050–0.075 $\mu$m), however the push to lowering the fly height is a never ending pursuit.

To achieve such a low fly height without crashing, it is critical that the fabricated ABS structure satisfies the designed requirements with tight tolerances. Several techniques have been used to produce such an ABS, including mechanical machining, ion milling, and reactive ion etching (RIE). For the more advanced ABS design such as Transverse Pressure Contour (TPC), there are steps on the ABS that are less than 1 micrometer deep. Consequently, the required tolerance is much tighter than mechanical machining can deliver. Ion milling has been the choice of the process for this type of step, however it does not have the throughput capacity like a reactive ion etcher. The technical challenge for reactive ion etching to produce such a step is the uniformity across the entire cathode.

The etch rate in a reactive ion etcher is higher around the cathode perimeter due to an edge effect on the plasma distribution and higher at the center because of the gas distribution, i.e., the gas inlet valve is typically at the center of the chamber. Many attempts have been conducted to modify the etch rate distribution, including modifying process parameters, such as gas pressure, gas composition, input power, etc. Other attempts to modify the etch rate distribution have focused on modifying chamber geometry, such as reactor can design, gas flow pattern, gas inlet shower head etc. While these methods have demonstrated that the rate uniformity can be improved, the overall distribution pattern remains unchanged.

It can be seen that there is a need for a method and apparatus for achieving etch rate uniformity in reactive ion etchers.

It can also be seen that there is a need for method and apparatus for tuning the overall distribution pattern in a reactive ion etcher to provide uniformity of the etch rate.

SUMMARY OF THE INVENTION

To overcome the limitations in the prior art described above, and to overcome other limitations that will become apparent upon reading and understanding the present specification, the present invention discloses a method and apparatus for achieving etch rate uniformity in a reactive ion etcher.

The present invention generates a plasma within a vacuum chamber for etching a substrate disposed at a cathode of a reactor can within the chamber. The plasma emanates from a top plate of the reactor can, and is influenced by localized magnetic fields for locally controlling etch rates across the cathode to produce a uniform etch rate distribution across the cathode.

A system in accordance with the principles of the present invention includes a vacuum chamber, a reactor can disposed within the chamber for containing a plasma for etching a substrate, and a magnet array for providing localized magnetic fields to locally control the etch rate to produce a desired etch rate distribution across the cathode. The magnetic field from the magnet array may be applied from outside the chamber. Alternatively, the magnet array may be disposed above the top plate of the reactor can. However, placement of the magnet array within the chamber facilitates greater precision in controlling the etch rate.

Other embodiments of a system in accordance with the principles of the invention may include alternative or optional additional aspects. One such aspect of the present invention is that the magnet array is disposed between the top plate and the vacuum chamber.

Another aspect of the present invention is that the desired etch rate distribution is a uniform etch rate distribution.

Another aspect of the present invention is that the magnet array comprises a plurality of individual magnets and a grid plate for holding the individual magnets in position.

Another aspect of the present invention is that the plasma used for etching is intensified locally by the magnetic fields of the individual magnets of the magnet array.

Yet another aspect of the present invention is that the intensification of the plasma is accomplished by trapping electrons along magnetic field lines created by the individual magnets.

Another aspect of the present invention is that the individual magnets in the magnet array are adjusted to provide a predefined localized magnetic field strength.

Another aspect of the present invention is that the individual magnets can each be tailored to provide different characteristics thereby providing variety to the field strength distribution.

Still another aspect of the present invention is that the magnetic pole of an individual magnet is reversed to reduce the local magnetic field.

Another aspect of the present invention is that the substrate comprises a plurality of carriers, and wherein each carrier has an associated individual magnet in the magnet array for controlling the etch rate at the carrier.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout:

FIG. 3a illustrates a typical prior art reactive ion etcher design;

FIG. 3b illustrates the reactive ion etcher design of FIG. 3a having modifications for producing a tunable local etch rate in a reactive ion etch system according to one embodiment of the present invention;

FIG. 5 is a table comparing a reactive ion etch run according to prior etching systems to a reactive ion etch run with a localized magnetic field according to one embodiment of the present invention.

DETAILED DESCRIPTION OF THE INVENTION

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides a reactive ion etcher and method wherein a tunable magnetic field is disposed at the peripheral of the chamber to achieve etch rate uniformity.

Figure 1:
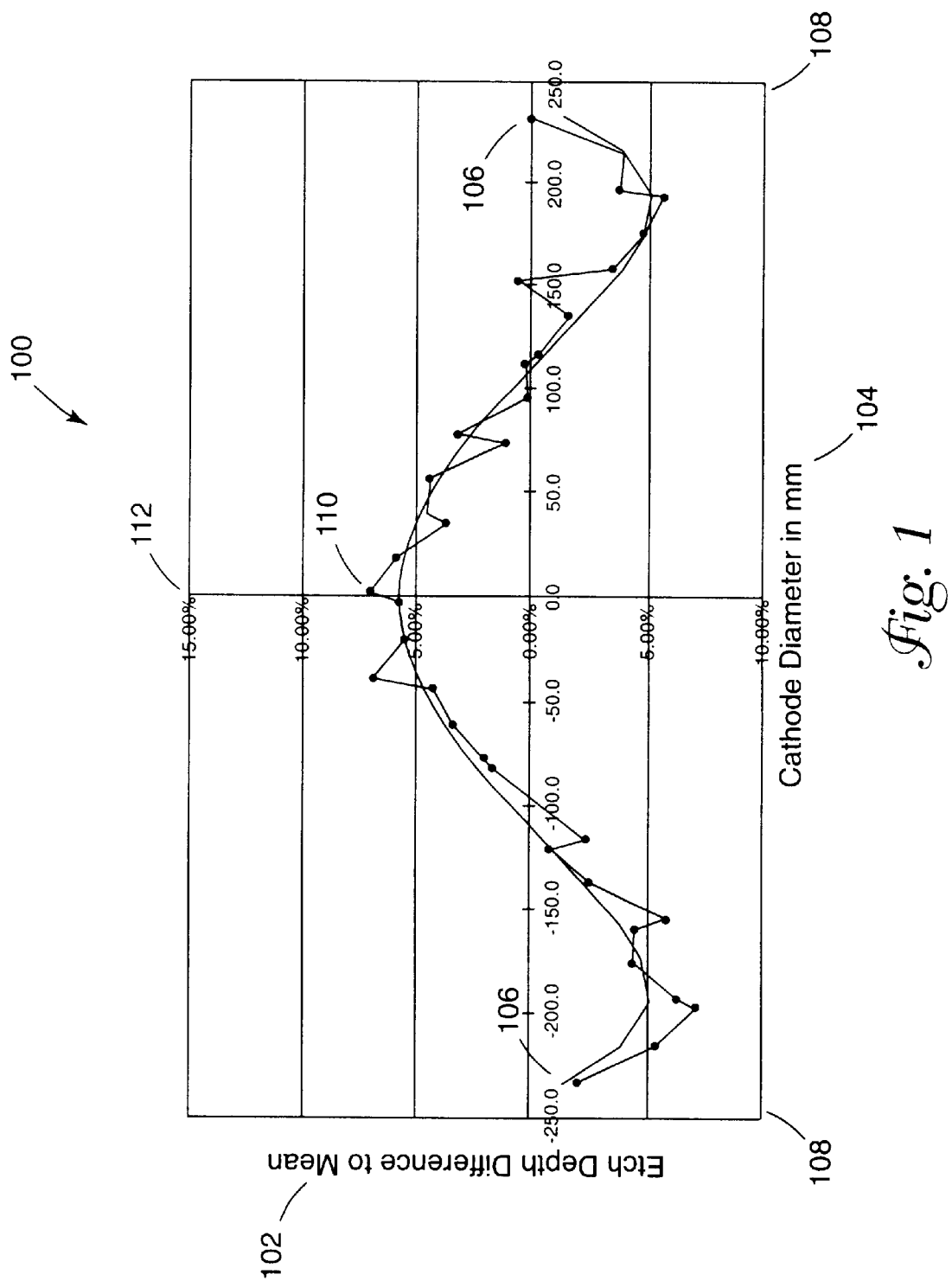
FIG. 1 illustrates a typical etch rate uniformity map across a reactive ion etcher cathode.

FIG. 1 illustrates a typical etch rate uniformity map 100 across a reactive ion etcher cathode. In FIG. 1 the etch depth difference to mean 102 is plotted against the cathode diameter 104. The higher depth difference 106 around the cathode perimeter 108 is believed to be due to an edge effect on the plasma distribution, and the higher rate 110 at the center 112 of the cathode is derived from the gas distribution, since that is where the gas inlet is located in the chamber.

Figure 2:
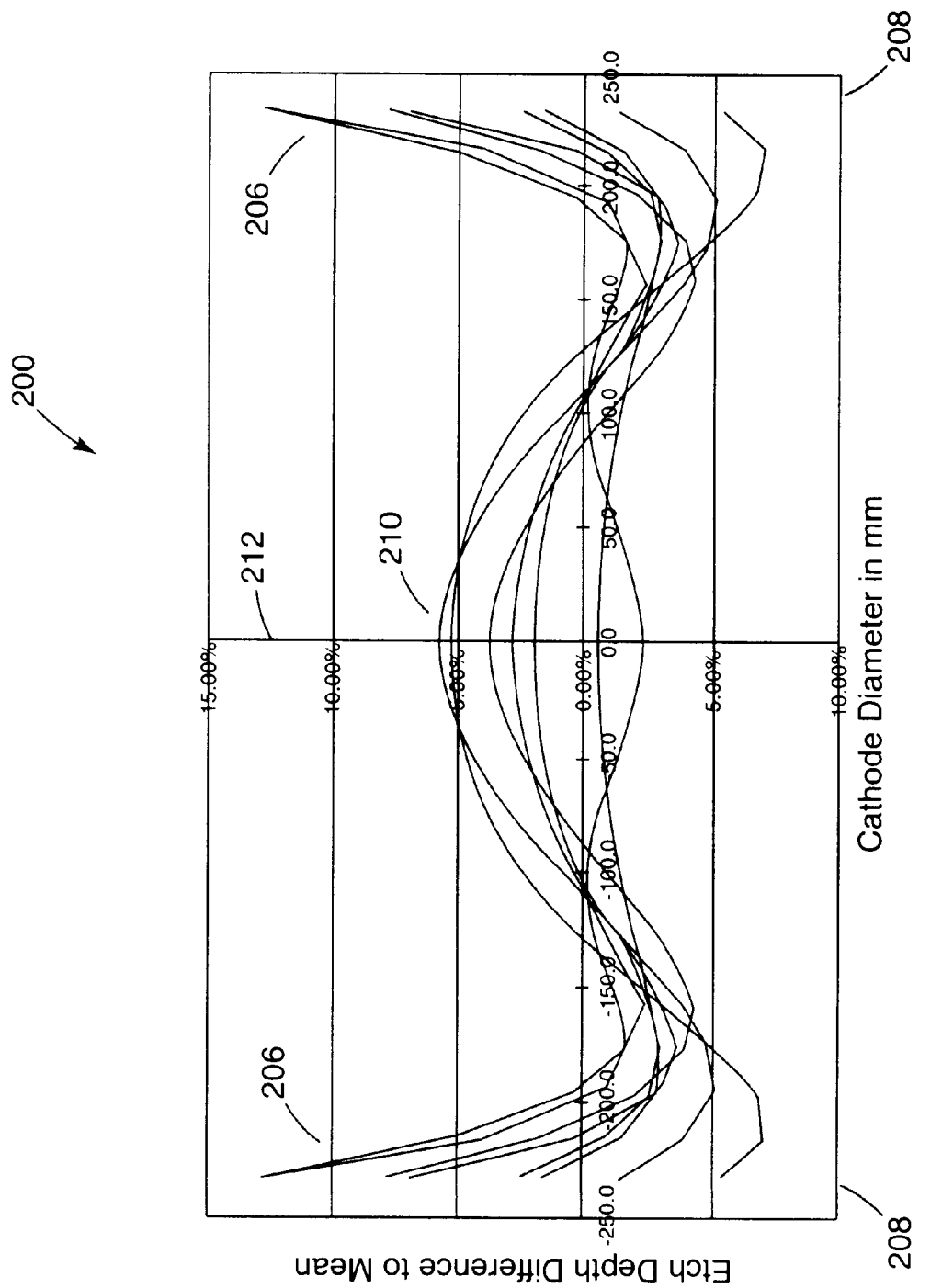
FIG. 2 illustrates several plots wherein one or more of parameters have been modified to improve the etch rate distribution.

As mentioned above, many attempts have been conducted to modify the etch rate distribution, including modifying process parameters, such as gas pressure, gas composition, input power, etc. Other attempts to modify the etch rate distribution have focused on modifying chamber geometry, such as reactor can design, gas flow pattern, gas inlet shower head, etc. FIG. 2 illustrates several plots 200 wherein one or more of the above-listed parameters have been modified to improve the etch rate distribution. From FIG. 2, the rate uniformity can be seen to have been improved by the efforts, however the overall distribution pattern, wherein higher etch rates 206, 210 occur near the periphery 208 and center 212 of the cathode, respectively, remains unchanged.

FIG. 3a illustrates a typical prior art reactive ion etcher design 300. The reactive ion etcher 300 includes a process chamber 310. Within the chamber 310 the plasma is contained in a reactor can 312 formed between a water-cooled top plate 316 and a cathode 318. Accordingly, the cathode 318 is disposed opposite to the top plate 316. The top plate 316 also includes a gas inlet 320 for directing a plasma stream (not shown) in the direction of the cathode 318. In the chamber 310 ions are accelerated from the top plate 316 towards cathode 318 and the material to be etched, e.g., substrate (not shown). The etching reaction is enhanced in the direction of travel of the ion.

FIG. 3b illustrates the reactive ion etcher design 350 of FIG. 3a having modifications for producing a "tunable" local etch rate in a reactive ion etch system according to one embodiment of the present invention. In FIG. 3b, reaction is confined in the reactor can 312 which is housed in the vacuum chamber 310. In FIG. 3b, the reactor can 312 includes a top plate 316, which is adjusted by making minor hardware modifications. A magnet array 370 is positioned on top of the top plate 316. The magnet array includes individual magnets 372 and is held in position by a grid plate 374.

Accordingly, the magnet array 370 provides a "tunable" local etch rate in a RIE system 350 such that a uniform etch rate distribution across the cathode 318 is obtained. The plasma used for etching can be intensified locally using the magnetic fields from the magnet array 370. This intensification of the plasma is accomplished by trapping the electron along the magnetic field lines. If the local magnetic field above the cathode 318 can be adjusted, the etch rate, which is proportional to the plasma density, is made to vary locally, i.e., near a particular magnet 372, to achieve a desired etch rate at the particular magnet 372 so that a desirable uniformity is obtained across the entire cathode 318.

In operation, individual magnets 372 in the magnet array 370 can be adjusted to provide proper strength of the local magnetic field. If necessary, an individual magnet 372 can be tailored to provide different characteristics thereby providing variety to the field strength distribution. To further extend the field strength distribution, it is entirely possible to not fully populate the magnets 372. In some cases, the magnetic pole can also be reversed to greatly reduce the local magnetic field. It can be seen then that the essence of the magnetic array is to provide the ability to vary local magnetic field strength, so that the etch rate, which is somewhat proportional to the magnetic field strength, can be adjusted locally to obtain a uniform etch rate across the entire cathode.

Figure 4:
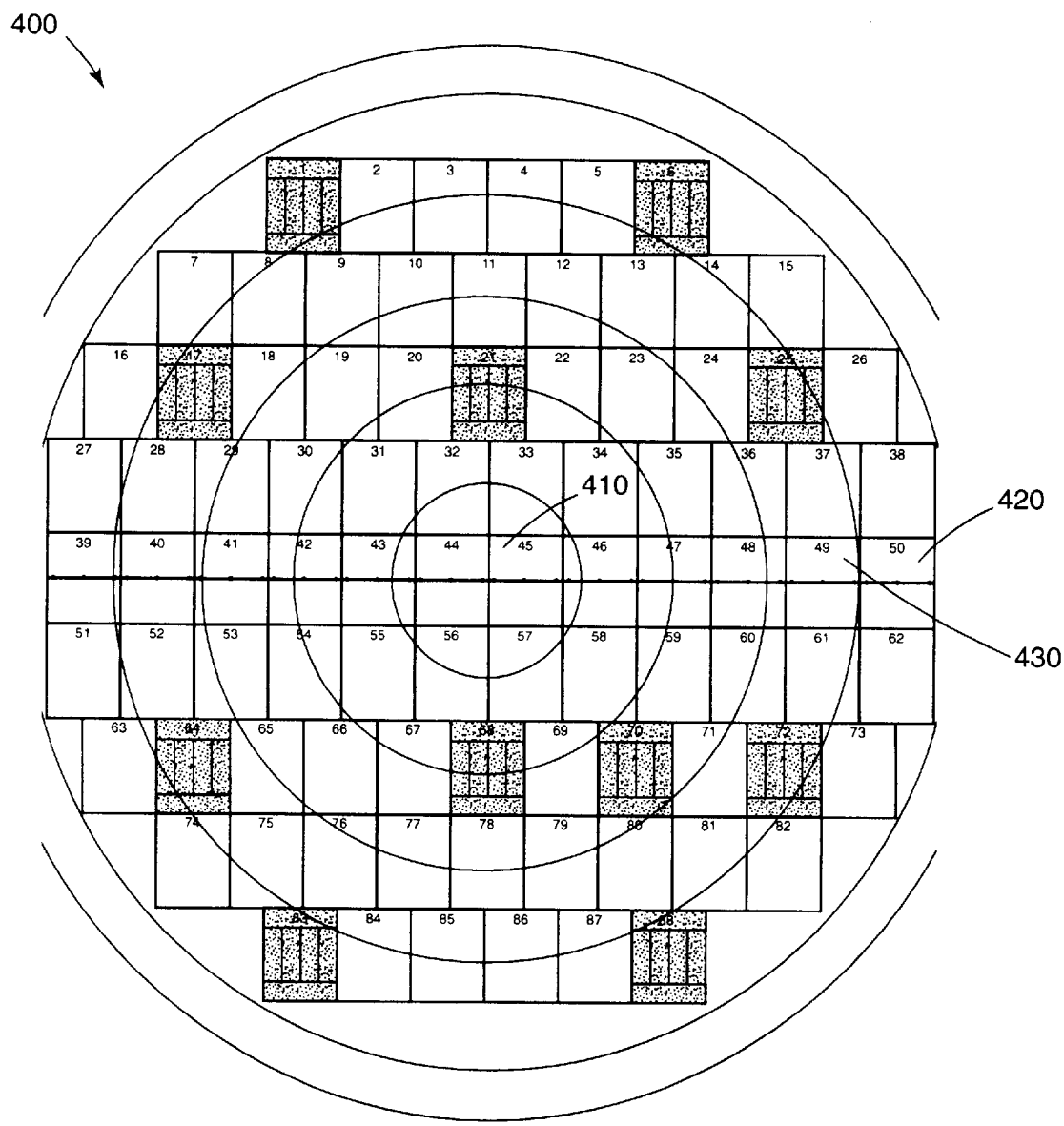
FIG. 4 illustrates the layout of carriers for such a system of FIG. 3b.

For example, a reactive ion etch system having a twenty-one inch cathode design can hold eighty-eight carriers for etching. FIG. 4 illustrates the layout of carriers 400 for such a system. Typically, position 45 (center) 410 in FIG. 3 has higher etch rate than position 50 (closer to edge) 420, as demonstrated by the distribution shown in FIG. 1. However, by positioning a magnetic field directly above edge locations, i.e., position 50 420 in FIG. 4, a more uniform etch rate across the carriers 400 can be obtained.

FIG. 5 is a table 500 comparing a reactive ion etch run according to prior etching systems 502 to a reactive ion etch run with a localized magnetic field 550 according to one embodiment of the present invention. The reactive ion etcher performing the reactive ion etch run with the magnetic field 550 used a spacing between the magnet and the carrier of approximately eight inches to produce an estimated magnetic field above the carrier of one-hundred Gauss.

The table 500 of FIG. 5 illustrates the enhancement provided by the magnet array. The enhanced etch rate at position 50 520 is given by:

$$\frac{19133 - 14255}{14255} = 34\%$$

The table 500 in FIG. 5 also illustrates that the magnetic field does not extend to position 45 510, for the rate is not affected by the magnet located above the position 50 520, which was eight inches away. It is also noted that in the second run 550, the rate at position 50 520 is higher than that at position 45 510. This is reverse from the normal condition (first run) 502 when no magnetic field is present. This indicates that with proper positioning of a localized magnet field over the cathode, the local etch rate can be adjusted to flatten the overall etch rate profile.

Nevertheless, in this experiment, the localized magnetic field was applied outside the chamber. As described above, the localized magnetic field allows the etch rate at the exterior position 520 to be matched with a centrally located position 510. However, those skilled in the art will recognize that the placement of the magnetic field outside the chamber does not allow the same precision in controlling the etch rate as a placement of the magnetic field above the top plate within the chamber. For example, referring again to FIG. 4, while position 50 420 can be improved with respect to position 45 410, controlling the etch rate at position 50 420 without influencing the etch rate of adjacent position 49 430 is problematic. The lack of precision is caused by the separation between the magnetic field and the substrate being etched and by the large field strength required by the distance between the substrate and the magnet. Therefore, placement of a magnet array in the reactor can as suggest by FIG. 3b is preferred.

In summary, a local magnetic field effect on the plasma density can be used to produce a very uniform etch rate on a large cathode in a reactive ion etcher. To vary the magnetic field strength locally, an array of magnets above the top plate is used. By properly adjusting the individual magnet strength, size, magnetic pole direction and the array grid design, the etch rate can be adjusted to any desirable uniformity. Further, the technique disclosed here is adaptable to any process condition and any original uniformity distribution. The ability to locally adjust the magnetic field to affect the local etch rate provides no constraint on the process conditions.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method of locally controlling etch rates in a reactive ion etcher, comprising the steps of:

generating a plasma within a vacuum chamber for etching a substrate disposed at a cathode of a reactor can within the chamber, the plasma emanating from a top plate of the reactor can;

influencing the plasma with localized magnetic fields provided by a magnet array between the top plate and the top ceiling of the chamber for locally controlling etch rates across the cathode; and producing a desired uniform etch rate distribution across the cathode as a result of the localized magnetic field.

2. The method of claim 1, wherein the magnet array comprises a plurality of individual magnets and a grid plate for holding the individual magnets in position.

3. The method of claim 2, wherein the step of producing the desired etch rate further comprises the step of selectively intensifying the magnetic field of individual magnets.

4. The method of claim 3, wherein the step of intensifying the plasma further comprises the step of trapping electrons along magnetic field lines created by the individual magnets.

5. The method of claim 2, wherein the step of providing localized magnetic fields further comprises adjusting individual magnets in the magnet array to provide a predefined localized magnetic field strength.

6. The method of claim 5, wherein the step of adjusting individual magnets further comprises the step of tailoring individual magnets to provide different characteristics thereby providing variety to the field strength distribution.

7. The method of claim 2, wherein the step of adjusting individual magnets further comprises the step of reversing the magnetic pole of an individual magnet to reduce the local magnetic field.

8. The method of claim 1, wherein the substrate is held by a plurality of carriers, and wherein each carrier has an associated individual magnet in the magnet array, and wherein the step of producing a desired etch rate distribution across the cathode as a result of the localized magnetic field further comprises the step of controlling the etch rate at each carrier by adjusting the characteristics of the individual magnets associated therewith.

* * * * *